(12) United States Patent
Kirimura

(10) Patent No.: US 8,703,606 B2
(45) Date of Patent: Apr. 22, 2014

(54) METHOD FOR MANUFACTURING SEMICONDUCTOR DEVICE HAVING A WIRING STRUCTURE

(75) Inventor: Tomoyuki Kirimura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 127 days.

(21) Appl. No.: 13/363,931

(22) Filed: Feb. 1, 2012

(65) Prior Publication Data

US 2012/0129338 A1     May 24, 2012

Related U.S. Application Data

(63) Continuation of application No. PCT/JP2009/064364, filed on Aug. 14, 2009.

(51) Int. Cl.
    *H01L 23/528*          (2006.01)

(52) U.S. Cl.
    USPC .................... 438/640; 438/717; 438/734

(58) Field of Classification Search
    CPC ........... H01L 2221/1021; H01L 2221/1026; H01L 2221/1031; H01L 2221/1036
    USPC .......... 6/736, 734, 717; 438/736, 734, 717, 438/640
    See application file for complete search history.

(56) References Cited

U.S. PATENT DOCUMENTS

| | | | | |
|---|---|---|---|---|
| 6,140,226 A | * | 10/2000 | Grill et al. | 438/637 |
| 7,259,089 B2 | | 8/2007 | Kanamura | |
| 2005/0158982 A1 | | 7/2005 | Kanamura | |
| 2008/0076260 A1 | * | 3/2008 | Muramatsu et al. | 438/736 |

FOREIGN PATENT DOCUMENTS

| | | |
|---|---|---|
| EP | 1184903 A1 | 3/2002 |
| JP | 11-186274 A | 7/1999 |
| JP | 11-274299 A | 10/1999 |
| JP | 2003-297920 A | 10/2003 |
| JP | 2005-203672 A | 7/2005 |
| JP | 2006-294771 A | 10/2006 |
| JP | 2008-171922 A | 7/2008 |

OTHER PUBLICATIONS

Notification of Transmittal Translation of the International Preliminary Report on Patentability (Form PCT/IB/338) of International Application No. PCT/JP2009/064364 mailed Mar. 22, 2012 with Forms PCT/IB/373 and PCT/ISA/237.
International Search Report of PCT/JP2009/064364, mailing date Nov. 10, 2009.

* cited by examiner

*Primary Examiner* — Fernando L Toledo
*Assistant Examiner* — Peter Bradford
(74) *Attorney, Agent, or Firm* — Westerman, Hattori, Daniels & Adrian, LLP

(57) ABSTRACT

When a wiring structure is formed by a trench-first dual damascene method, a first hard mask for forming via holes and a second hard mask for forming wiring trenches are sequentially formed on an interlayer insulating film, openings are formed at the first hard mask while using the second hard mask as a mask, and thereafter, the openings are expanded in a lateral direction by an isotropic etching to form openings, via holes are formed by etching the interlayer insulating film while using the first hard mask and the second hard mask as masks, and wiring trenches communicating with the via holes are formed by etching the interlayer insulating film while using the second hard mask as a mask.

12 Claims, 17 Drawing Sheets

METHOD FOR MANUFACTURING SEMICONDUCTOR DEVICE HAVING A WIRING STRUCTURE

CROSS-REFERENCE TO RELATED APPLICATION

This application is a Continuation of International Application No. PCT/JP2009/064364, with an international filing date of Aug. 14, 2009, which designating the United States of America, the entire contents of which are incorporated herein by reference.

FIELD

The present invention relates to a manufacturing method of a semiconductor device, and it is particularly suitable applying for a case when a wiring structure is formed.

BACKGROUND

According to a large scale and highly integrated semiconductor device in recent years, a design rule of wirings is also miniaturized in accordance with generation. Conventionally, the wirings are formed by performing a patterning of a conductive material by using lithography and dry etching after the conductive material is deposited on an insulating film. However, a technical limit begins to occur as the generation proceeds. Accordingly, a method so-called a damascene wiring in which wiring trenches and connection holes are formed at the insulating film, and thereafter, a wiring material is embedded in the wiring trenches and the connection holes to form the wiring structure is used as a new formation process of wiring taking over the conventional formation process. It is easy for the damascene process to form a wiring layer by using a low-resistance conductive material such as copper which is difficult to perform the dry etching, and it is extremely effective to form a fine and low-resistance wiring structure.

There are a single damascene method in which the wiring trenches and the connection holes are embedded separately with the conductive material, and a dual damascene method in which the wiring trenches and the connection holes (via holes) are simultaneously embedded with the conductive material in the damascene wiring. Between them, the embedding of the conductive material to the wiring trenches and the via holes is performed by one time process in the dual damascene method, and therefore, there is an advantage in which a manufacturing method is simplified compared to the single damascene method.

In the dual damascene method, there are a via-first method (refer to Patent Document 1) forming the via holes first and a trench-first method (refer to Patent Document 2) forming the wiring trenches first.

In the dual damascene method, problems such that a diameter of the via hole becomes small, and a leakage current occurs between adjacent wirings occur if a positional displacement between the via holes and the wiring trenches occurs when the via holes and the wiring trenches are formed.

Patent Document 1: Japanese Laid-open Patent Publication No. 11-274299

Patent Document 2: Japanese Laid-open Patent Publication No. 11-186274

SUMMARY

An aspect of a manufacturing method of a semiconductor device, includes: forming a first interlayer insulating film above a semiconductor substrate; forming a wiring layer in the first interlayer insulating film; forming a second interlayer insulating film above the first interlayer insulating film and the wiring layer; forming a first mask layer above the second interlayer insulating film and forming a second mask layer above the first mask layer; forming a first opening portion in the second mask layer; forming a resist layer including a second opening portion above the second mask layer at a position at least partially overlapping with the first opening portion; performing a first etching in which the first mask layer is etched while using the resist layer as a mask or the resist layer and the second mask layer as masks; performing a second etching in which the first mask layer is etched in a direction parallel to a surface of the semiconductor substrate after the performing the first etching; forming connection holes in the second interlayer insulating film by etching the second interlayer insulating film while using the first mask layer and the second mask layer as masks after the performing the second etching; forming wiring trenches in the second interlayer insulating film by etching the first mask layer and the second interlayer insulating film while using the second mask layer as a mask after the forming the connection holes; and forming a conductive film in the connection holes and the wiring trenches.

Another aspect of a manufacturing method of a semiconductor device includes: forming a first interlayer insulating film above a semiconductor substrate; forming a wiring layer in the first interlayer insulating film; forming a second interlayer insulating film above the first interlayer insulating film and the wiring layer; forming a first mask layer above the second interlayer insulating film, forming a second mask layer above the first mask layer, and forming a third mask layer above the second mask layer; forming a first opening portion in the third mask layer; forming a resist layer including a second opening portion above the third mask layer at a position at least partially overlapping with the first opening portion; performing a first etching in which the second mask layer is etched while using the resist layer and the third mask layer as masks; performing a second etching in which the second mask layer is etched in a direction parallel to a surface of the semiconductor substrate after the performing the first etching; forming connection holes in the second interlayer insulating film by etching the first mask layer and the second interlayer insulating film while using the third mask layer and the second mask layer as masks after the performing the second etching; forming wiring trenches in the second interlayer insulating film by etching the second mask layer, the first mask layer and the second interlayer insulating film while using the third mask layer as a mask after the forming the connection holes; forming a conductive film in the connection holes and the wiring trenches; and removing the first mask layer, the second mask layer, and the conductive film above the second interlayer insulating film by polishing after the depositing the conductive film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
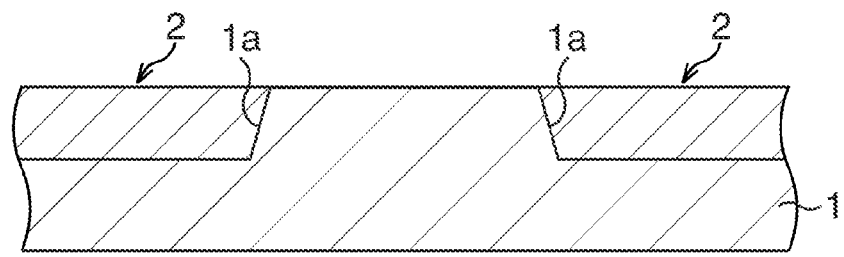
FIG. 1A is a schematic sectional view illustrating a manufacturing method of a MOS transistor according to a first embodiment.

At first, problems of a via-first method and a trench-first method examined by the present inventors are described. In the via-first method, a resist mask having an opening pattern of via holes which is directly aligned relative to lower layer wirings is formed on an interlayer insulating film, and etching is performed by using this resist mask to form the via holes at the interlayer insulating film. Accordingly, it is possible to form via holes of which positional displacement with the lower layer wirings is small.

However, there are problems as stated below in the via-first method.

In the via-first method, the via holes are formed at the interlayer insulating film, and thereafter, a resist mask having an opening pattern of wiring trenches is formed at upward of the via holes, and etching is performed by using this resist mask to form the wiring trenches at the interlayer insulating film. Accordingly, when the opening pattern of the wiring trenches is positionally displaced relative to the via holes, a distance between adjacent wirings becomes short when the wiring trenches and the via holes formed at the interlayer insulating film are embedded with a conductive material, to be a cause of current leakage between wirings.

On the other hand, in the trench-first method, the wiring trenches are formed at the interlayer insulating film and an insulating film which is a different kind from the interlayer insulating film or a metal film provided at upward of the interlayer insulating film, and a resist mask having the opening pattern of the via holes is formed at upward of the wiring trenches. The insulating film which is the different kind from the interlayer insulating film or the metal film provided above the interlayer insulting film functions as an etching stopper film when the via holes are formed at the interlayer insulating film by the etching while using the resist mask having the opening pattern of the via holes as a mask.

The via holes are not formed at the interlayer insulating film below a portion where the opening pattern of the via holes and the etching stopper film are partially overlapped even though the etching is performed under a state in which the opening pattern of the via holes is positionally displaced relative to the wiring trenches. Accordingly, it is prevented that the distance between the adjacent wirings becomes short when the wiring trenches and the via holes formed at the interlayer insulating film are embedded with the conductive material, and the current leakage between the wirings can be suppressed. However, the via holes are not formed at the interlayer insulating film below the portion where the opening pattern of the via holes and the etching stopper film are partially overlapped, and therefore, the via holes are each formed to be a smaller diameter than an initially planned desired diameter. Accordingly, a width of a via portion of the formed wiring structure becomes also narrow, and there is a possibility to incur an increase of a resistance value.

Hereinafter, embodiments of the present invention are described. Respective embodiments of a manufacturing method of a semiconductor device are described. In the following respective embodiments, a MOS transistor is exemplified as the semiconductor device, and a wiring structure thereof is formed by the dual damascene method in the trench-first method. Note that the semiconductor device to which the respective embodiments are applied is not limited to the MOS transistor, but it is applicable for the other semiconductor devices such as various kinds of transistors and semiconductor memories.

First Embodiment

FIG. 1A to FIG. 8B are schematic sectional views illustrating a manufacturing method of a MOS transistor according to a first embodiment in process sequence.

As illustrated in FIG. 1A, a silicon (Si) semiconductor substrate 1 is prepared, and an interelement isolation structure, for example, an STI (Shallow Trench Isolation) interelement isolation structure 2 is formed at an element isolation region on the semiconductor substrate 1 to define an active region.

In detail, at first, lithography and dry etching are performed for the element isolation region on the semiconductor substrate 1 to form isolation trenches 1a.

Next, an insulating film (for example, a silicon oxide film and so on) embedding interelement isolation trenches is deposited by a chemical vapor deposition (CVD) method and so on, and it is smoothed by a Chemical Mechanical Polishing (CMP) method and so on. The STI interelement isolation structure 2 in which inside of the isolation trenches 1a are filled by an insulator is thereby formed.

Figure 1B:
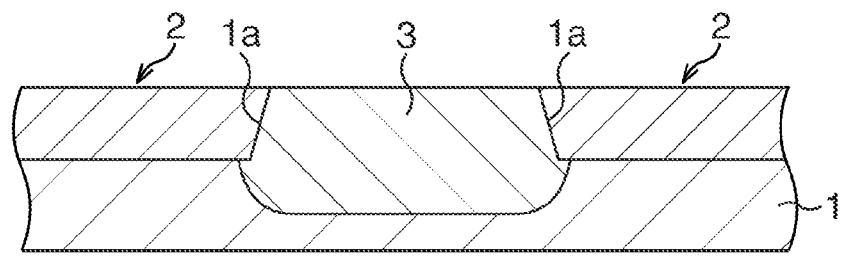
FIG. 1B is a schematic sectional view illustrating the manufacturing method of the MOS transistor according to the first embodiment subsequent to FIG. 1A.

Subsequently, an impurity is introduced into the active region defined by the STI interelement isolation structure 2 to form a well region 3 as illustrated in FIG. 1B.

In detail, a resist pattern (not-illustrated) opening a predetermined portion of the active region is formed by the lithography, and a predetermined impurity is introduced into the semiconductor substrate 1 by using this resist pattern as a mask. When the MOS transistor to be formed is N-type, a P-type impurity such as boron ($B^+$) is ion-implanted. When the MOS transistor to be formed is P-type, an N-type impurity such as phosphorus ($P^+$) or arsenic ($As^+$) is ion-implanted. The well region 3 is thereby formed at the predetermined active region. The resist pattern is removed by an asking or a process using predetermined chemical solution and so on.

Figure 1C:
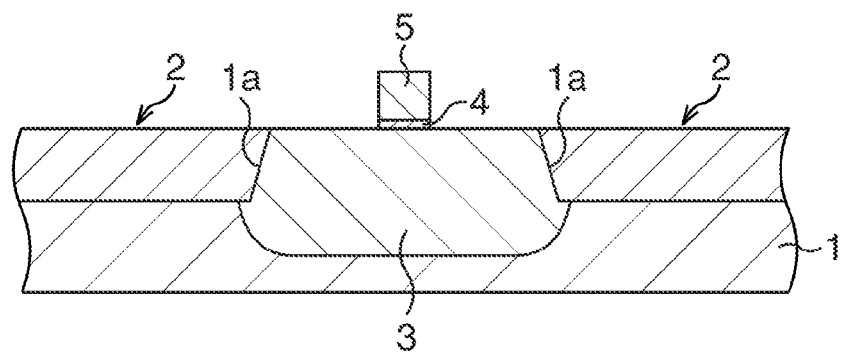
FIG. 1C is a schematic sectional view illustrating the manufacturing method of the MOS transistor according to the first embodiment subsequent to FIG. 1B.

Subsequently, a gate insulating film 4 and a gate electrode 5 on the gate insulating film 4 are formed as illustrated in FIG. 1C.

In detail, at first, an insulating film composed of, for example a silicon oxide film is formed at a surface of the active region by a thermal oxidation method and so on, and thereafter, a polycrystalline silicon film is deposited on the insulating film by the CVD method and so on.

Next, the polycrystalline silicon film and the insulating film are collectively processed to be a predetermined electrode shape by the lithography and the dry etching. The gate electrode 5 via the gate insulating film 4 is thereby formed on the active region.

Figure 2A:
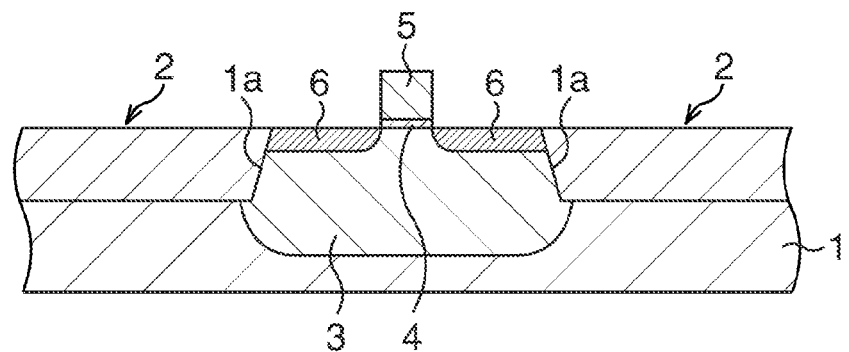
FIG. 2A is a schematic sectional view illustrating the manufacturing method of the MOS transistor according to the first embodiment subsequent to FIG. 1C.

Subsequently, extension regions 6 are formed at both side portions of the gate electrode 5 of the active region as illustrated in FIG. 2A.

In detail, an impurity is introduced into the both side portions of the gate electrode 5 of the active region while using the gate electrode 5 as a mask. When the MOS transistor to be formed is N-type, the N-type impurity such as phosphorus ($P^+$) or arsenic ($As^+$) is ion-implanted. When the MOS transistor to be formed is P-type, the P-type impurity such as boron ($B^+$) is ion-implanted. The extension regions 6 are thereby formed at the both side portions of the gate electrode 5 of the active region.

Figure 2B:
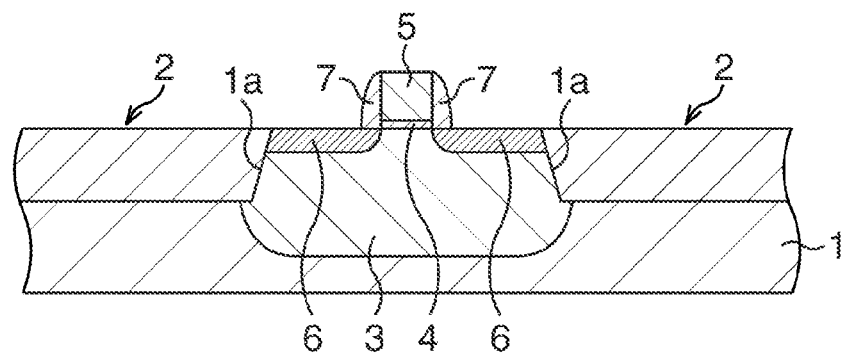
FIG. 2B is a schematic sectional view illustrating the manufacturing method of the MOS transistor according to the first embodiment subsequent to FIG. 2A.

Subsequently, sidewall insulating films 7 are formed at both side surfaces of the gate electrode 5 and the gate insulating film 4 as illustrated in FIG. 2B.

In detail, at first, an insulating film, for example, a silicon oxide film is deposited on a whole surface of the semiconductor substrate 1 including the gate electrode 5 by the CVD method and so on.

Next, an anisotropic dry etching (etchback) process is performed for a whole surface of the insulating film. Accordingly, the insulating film remains only at the both side surfaces of the gate electrode 5 and the gate insulating film 4, and thereby, the sidewall insulating films 7 are formed.

Figure 2C:
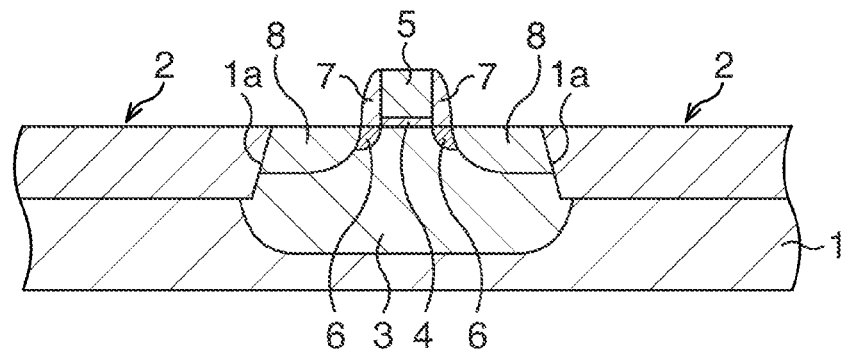
FIG. 2C is a schematic sectional view illustrating the manufacturing method of the MOS transistor according to the first embodiment subsequent to FIG. 2B.

Subsequently, source/drain regions 8 are formed at the both side portions of the gate electrode 5 as illustrated in FIG. 2C.

In detail, an impurity is introduced into the both side portions of the gate electrode 5 and the sidewall insulating films 7 of the active region while using the gate electrode 5 and the sidewall insulating films 7 as masks. When the MOS transistor to be formed is N-type, the N-type impurity such as phosphorus ($P^+$) or arsenic ($As^+$) is ion-implanted. When the MOS transistor to be formed is P-type, the P-type impurity such as boron ($B^+$) is ion-implanted. The source/drain regions 8 are thereby formed so as to partially overlap with the extension regions 6 at the both side portions of the gate electrode 5 and the sidewall insulating films 7 of the active region.

Figure 3A:
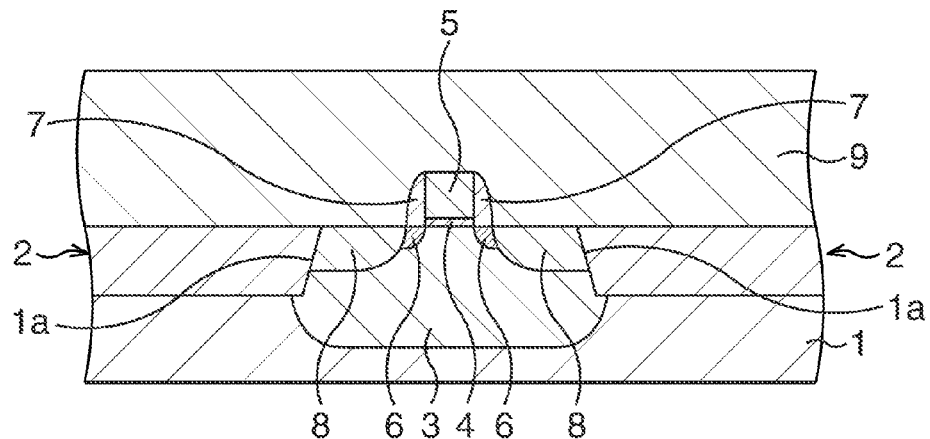
FIG. 3A is a schematic sectional view illustrating the manufacturing method of the MOS transistor according to the first embodiment subsequent to FIG. 2C.

Subsequently, an insulating film is deposited on the whole surface of the semiconductor substrate 1 by the CVD method and so on for a film thickness to embed the gate electrode 5 to form an interlayer insulating film 9 as illustrated in FIG. 3A. For example, a silicon oxide is applied as an insulator forming the interlayer insulating film 9.

Figure 3B:
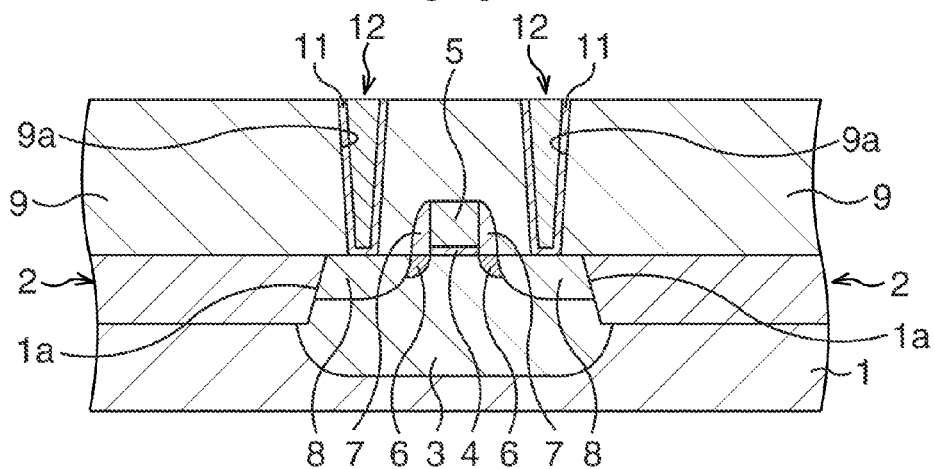
FIG. 3B is a schematic sectional view illustrating the manufacturing method of the MOS transistor according to the first embodiment subsequent to FIG. 3A.

Subsequently, contact plugs 12 are formed as illustrated in FIG. 3B.

In detail, at first, an open hole process is selectively performed for the interlayer insulating film 9 by the lithography and the dry etching to form contact holes 9a each exposing a part of the surface of the source/drain region 8.

Next, Ti, TiN, or a laminated film thereof or the like is deposited on the interlayer insulating film 9 by a sputtering method and so on so as to cover an internal surfaces of the contact holes 9a to form a predetermined base film 11.

Next, a conductive material composed of, for example, tungsten (W) is deposited on the interlayer insulating film 9 by the CVD method and so on so as to embed inside of the contact holes 9a via the base film 11.

Next, the conductive material and the base film 11 on the interlayer insulating film 9 are smoothed by the CMP method and so on. The contact plugs 12 in which inside of the contact holes 9a are each filled with the conductive material via the base film 11 are thereby formed.

Figure 3C:
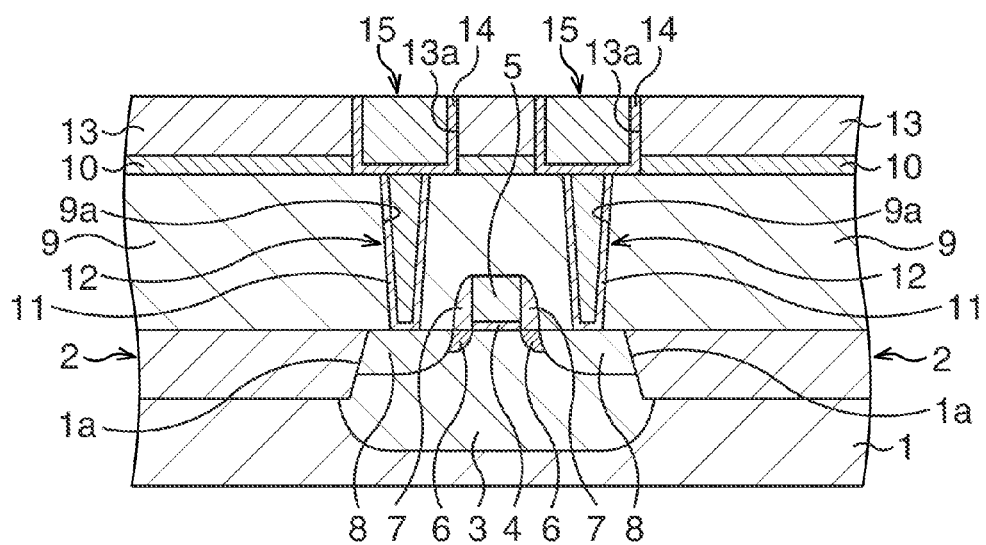
FIG. 3C is a schematic sectional view illustrating the manufacturing method of the MOS transistor according to the first embodiment subsequent to FIG. 3B.

Subsequently, lower layer wirings 15 connected to the contact plugs 12 are formed on the interlayer insulating film 9 by the single damascene method as illustrated in FIG. 3C.

At first, a protective film 10 is formed on the interlayer insulating film 9 by the CVD method and so on for a film thickness of, for example, approximately 30 nm to cover upper surfaces of the contact plugs 12. For example, SiC is applied as an insulator forming the protective film 10.

Next, an interlayer insulating film 13 is formed on the protective film 10 by the CVD method and so on for a film thickness of, for example, approximately 150 nm. For example, SiOC is applied as an insulator forming the interlayer insulating film 13.

Next, wiring trenches 13a are formed at the interlayer insulating film 13 and the protective film 10 by the lithography and the dry etching so as to expose at least a part of upper surfaces of the contact plugs 12.

Next, for example, a laminated film of Ta and TaN is deposited on the interlayer insulating film 13 by the sputtering method and so on so as to cover internal surfaces of the wiring trenches 13a to form a base film 14 as a barrier metal.

Next, a conductive material composed of, for example, Cu or a Cu alloy is formed on the interlayer insulating film 13 so as to embed inside of the wiring trenches 13a via the base film 14 by an electrolytic plating method and so on.

Next, the conductive material and the base film 14 on the interlayer insulating film 13 are removed and smoothed by the CMP method and so on. The lower layer wirings 15 in which each inside of the wiring trench 13a is filled with the conductive material via the base film 14 are thereby formed. Here, the base film 14 has a function to suppress that the conductive material diffuses in the interlayer insulating film 13.

Subsequently, wiring structures 28 connected to the lower layer wirings 15 are formed by the trench-first dual damascene method as illustrated in FIG. 4A to FIG. 8A. Only a portion at upward of the lower layer wirings 15 is illustrated, and the illustration of a portion at downward of the contact plugs 12 is not given in respective drawings of FIG. 4A to FIG. 8B for the convenience of illustration.

Figure 4A:
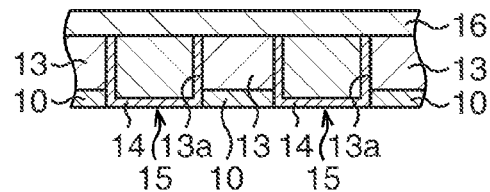
FIG. 4A is a schematic sectional view illustrating the manufacturing method of the MOS transistor according to the first embodiment subsequent to FIG. 3C.

In detail, at first, a protective film 16 is formed on the interlayer insulating film 13 by the CVD method and so on for a film thickness of, for example, approximately 30 nm so as to cover upper surfaces of the lower layer wirings 15 as illustrated in FIG. 4A. For example, SiC is applied as an insulator forming the protective film 16.

Figure 4B:
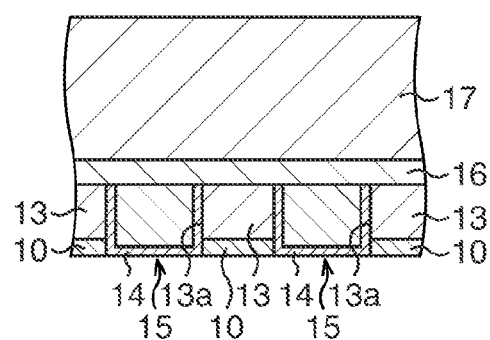
FIG. 4B is a schematic sectional view illustrating the manufacturing method of the MOS transistor according to the first embodiment subsequent to FIG. 4A.

Next, an interlayer insulating film 17 is formed on the protective film 16 by the CVD method and so on for a film thickness of, for example, approximately 250 nm as illustrated in FIG. 4B. For example, SiOC is applied as an insulator forming the interlayer insulating film 17.

Figure 4C:
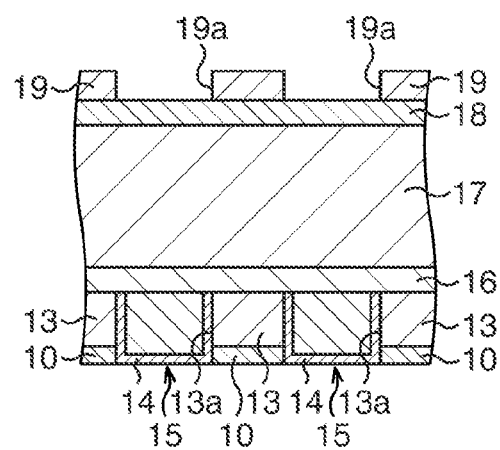
FIG. 4C is a schematic sectional view illustrating the manufacturing method of the MOS transistor according to the first embodiment subsequent to FIG. 4B.

Next, a first hard mask 18 and a second hard mask 19 constituting a two-layer hard mask are lamination-formed on the interlayer insulating film 17 as illustrated in FIG. 4C.

At first, the first hard mask 18 is formed on the interlayer insulating film 17 for a film thickness of approximately 60 nm, and the second hard mask 19 is formed on the first hard mask 18 for a film thickness of approximately 30 nm in sequence. The second hard mask 19 is processed by the lithography and the dry etching, to form openings 19a to form wiring trenches of a wiring portion being a component of the wiring structure at the second hard mask 19.

For example, one kind selected from $SiO_2$, SiN is applied as a material forming the first hard mask 18, and for example, one kind selected from TiN, TaN, SiC is applied as a material forming the second hard mask 19. The material of the first hard mask 18 and the material of the second hard mask 19 can be used by arbitrary combining from among the above. Here, a case when SiN is used as the material of the first hard mask 18, and TiN or TaN (hereinafter, referred to as TiN and so on) is used as the material of the second hard mask 19 is exemplified.

Figure 5A:
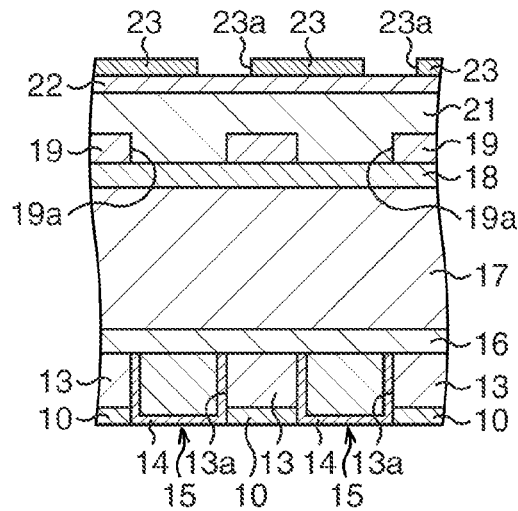
FIG. 5A is a schematic sectional view illustrating the manufacturing method of the MOS transistor according to the first embodiment subsequent to FIG. 4C.

Next, a resin film 21, a TEOS film 22 and a resist pattern 23 are sequentially formed as illustrated in FIG. 5A.

At first, for example, a predetermined organic resin material is coated on the second hard mask 19 for a film thickness of approximately 280 nm to form the resin film 21.

Next, the TEOS film 22 is formed on the resin film 21 for a film thickness of approximately 30 nm, and thereafter, a resist is coated on the TEOS film 22. At this time, a bottom antireflective film (BARC film) may be formed on the resist.

Next, the resist (and the bottom antireflective coating film) is (are) processed by the lithography, and the resist pattern 23 having openings 23a to form via holes at a via portion being the component of the wiring structure is formed. Note that a case is exemplified in FIG. 5A in which the openings 23a of the resist pattern 23 are formed slightly displaced from initially planned positions (positions matching with predetermined portions within the openings 19a of the second hard mask 19 existing at a lower layer).

Figure 5B:
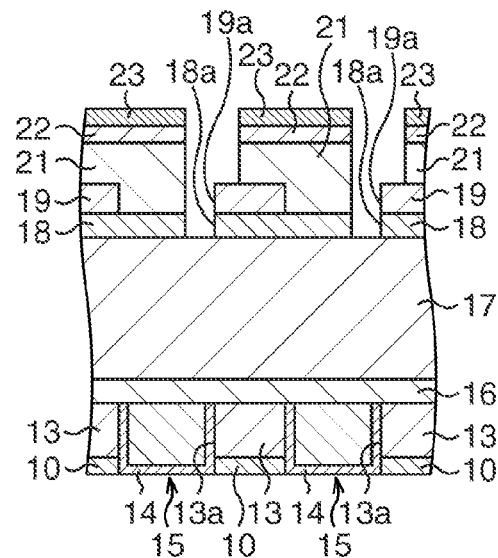
FIG. 5B is a schematic sectional view illustrating the manufacturing method of the MOS transistor according to the first embodiment subsequent to FIG. 5A.

Next, the first hard mask 18 is processed by the dry etching as illustrated in FIG. 5B.

In detail, the TEOS film 22, the resin film 21 and the first hard mask 18 are processed by the dry etching while using the resist pattern 23 as a mask.

At first, gas containing oxygen is used as etching gas to perform the etching of the TEOS film 22 and the resin film 21. The resin film 21 is the organic material, and therefore, it is etched by a plasma of the gas containing oxygen. On the other hand, SiN of the first hard mask 18 and TiN and so on of the second hard mask 19 are difficult to be etched by the plasma of the gas containing oxygen. Accordingly, it is possible to appropriately stop the dry etching on the first hard mask 18.

Subsequent to the etching of the TEOS film 22 and the resin film 21, the first hard mask 18 is dry etched. At this time, a condition in which an etching rate of SiN of the first hard mask 18 is higher than those of TiN and so on of the second hard mask 19 and SiOC of the interlayer insulating film 17 is selected so that the second hard mask 19 and the interlayer insulating film 17 are not etched. Specifically, for example, a high-frequency power (13.56 MHz) of 500 W is applied to a plate electrode at a pressure of 50 mT to perform the dry etching under a condition of a substrate temperature of 25° C. while introducing mixed gas of $CH_3F$ gas with a flow rate of 50 sccm, $O_2$ gas with a flow rate of 30 sccm, and Ar gas with a flow rate of 500 sccm as etching gas into a chamber in a vacuum chamber of a parallel plate type reactive ion etching device. It is possible to appropriately stop the dry etching on the interlayer insulating film 17 under this etching condition because etching selection ratio of SiN to SiOC is high.

In the etching of the first hard mask 18, the openings 23a of the resist pattern 23 are formed while being positionally displaced relative to the openings 19a of the second hard mask 19 as stated above. Accordingly, narrow-width openings 18a in hole like shapes (for example, approximately a semicircular state) defined by openings in wiring trench shapes formed at the resin film 21 and the openings 19a in via hole shapes of the second hard mask 19 are formed at the first hard mask 18.

Figure 5C:
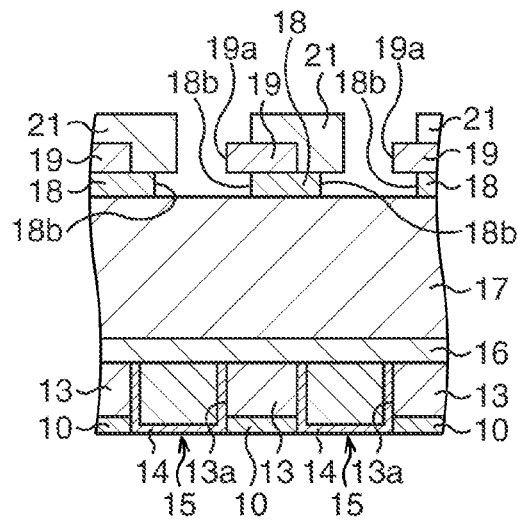
FIG. 5C is a schematic sectional view illustrating the manufacturing method of the MOS transistor according to the first embodiment subsequent to FIG. 5B.

Next, an isotropic etching is performed to expand the opening 18a by performing a side etching of the first hard mask 18 in a direction parallel to the surface of the semiconductor substrate 1 as illustrated in FIG. 5C. The diameters of the openings 18a are expanded to be openings 18b in approximately a hole state by this isotropic etching.

The resist pattern 23 and the TEOS film 22 are removed until a completion of the isotropic etching of the first hard mask 18.

A chemical dry etching or a wet etching is conceivable as the isotropic etching.

The chemical dry etching is performed under a condition in which mixed gas of $CF_4$ gas with a flow rate of 100 sccm and $O_2$ gas with a flow rate of 150 sccm is used as the etching gas, a plasma is generated by remote by exciting with a high-frequency power of 400 W to introduce into a vacuum chamber, under a pressure of 300 mTorr and a substrate temperature of 25° C. by, for example, a down-flow type chemical dry etching device.

The wet etching uses, for example, a solution of hydrofluoric acid as an etching solution. A mixed solution of the hydrofluoric acid and ammonium fluoride is used as the etching solution, and the wet etching may be performed by using a solution of which pH is adjusted. A composition of the etching solution is not limited to the above, but it is suitable to select a chemical solution in which the etching rate of the first hard mask 18 becomes larger than the etching rates of the resin film 21, the second hard mask 19, and the interlayer insulating film 17.

Figure 6A:
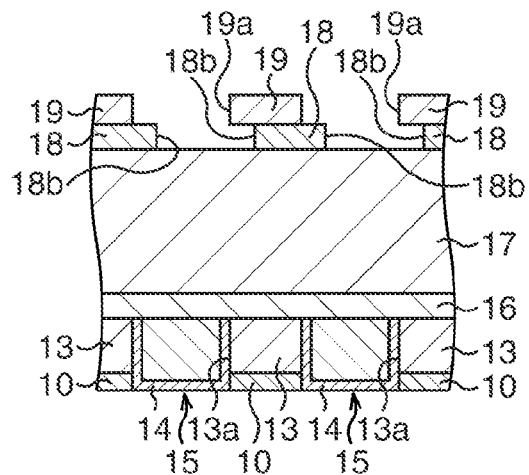
FIG. 6A is a schematic sectional view illustrating the manufacturing method of the MOS transistor according to the first embodiment subsequent to FIG. 5C.

Next, the resin film 21 is removed by asking as illustrated in FIG. 6A.

Figure 6B:
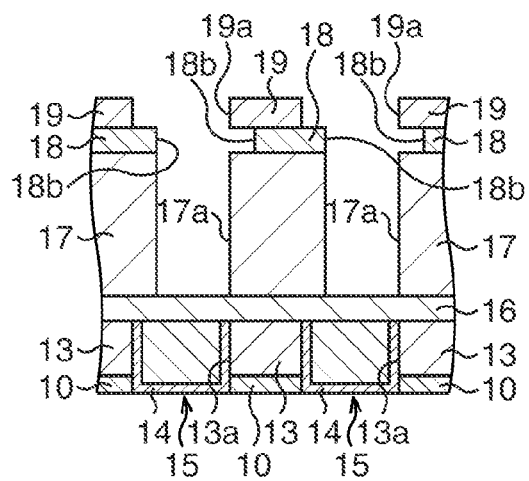
FIG. 6B is a schematic sectional view illustrating the manufacturing method of the MOS transistor according to the first embodiment subsequent to FIG. 6A.

Next, openings 17a in the via hole state are formed at the interlayer insulating film 17 as illustrated in FIG. 6B.

In detail, the interlayer insulating film 17 is dry etched by using the first hard mask 18 and the second hard mask 19 as masks. This dry etching is necessary to be performed with an etching condition of which etching selection ratio of SiOC to SiN and TiN and so on is high so that SiOC of the interlayer insulating film 17 is etched and SiN of the first hard mask 18 and TiN and so on of the second hard mask 19 are not etched. At this time, the first hard mask 18 and the second hard mask 19 become the masks, the interlayer insulating film 17 is etched in a shape following a portion where the opening 18b of the first hard mask 18 and the opening 19a of the second hard mask 19 are overlapped, and the openings 17a in the via hole shapes are formed at the interlayer insulating film 17.

Figure 6C:
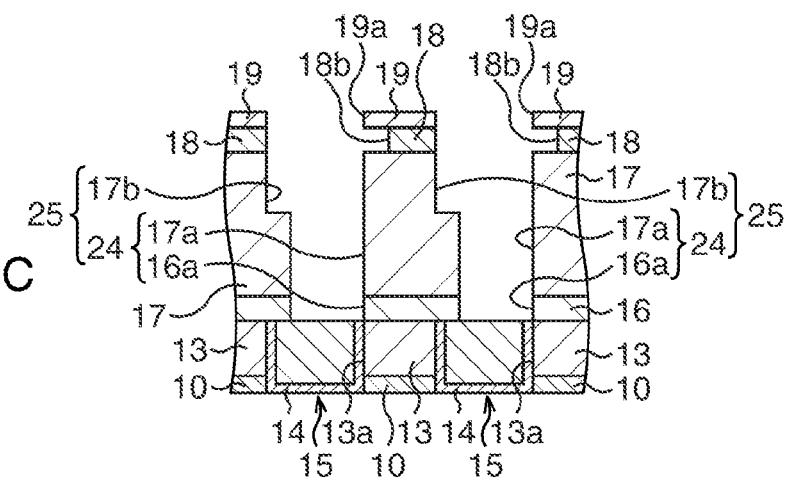
FIG. 6C is a schematic sectional view illustrating the manufacturing method of the MOS transistor according to the first embodiment subsequent to FIG. 6B.

The first hard mask 18, an upper portion of the interlayer insulating film 17, and the protective film 16 are dry etched while using the second hard mask 19 as a mask as illustrated in FIG. 6C subsequent to the etching of the interlayer insulating film 17. This dry etching is necessary to be performed with an etching condition of which etching selection ratios of SiN, SiOC and SiC to TiN and so on are high so that SiN of the first hard mask 18, SiOC of the interlayer insulating film 17, and SiC of the protective film 16 are etched and TiN and so on of the second hard mask 19 is not etched. At this time, the second hard mask 19 becomes the mask, and the first hard mask 18 and the upper portion of the interlayer insulating film 17 are etched into a shape following the opening 19a of the second hard mask 19. At the same time, openings 16a in the via hole shapes following the openings 17a of the interlayer insulating film 17 are formed at the protective film 16, and a part of surfaces of the lower layer wirings 15 exposes. At this time, wiring trenches 17b are formed at the upper portion of the interlayer insulating film 17, and via holes 24 each made up of the opening 17a and the opening 16a are formed at a lower portion of the interlayer insulating film 17 and the protective film 16. The wiring trench 17b and the via hole 24 are communicated to constitute a wiring structure trench 25.

Figure 7A:
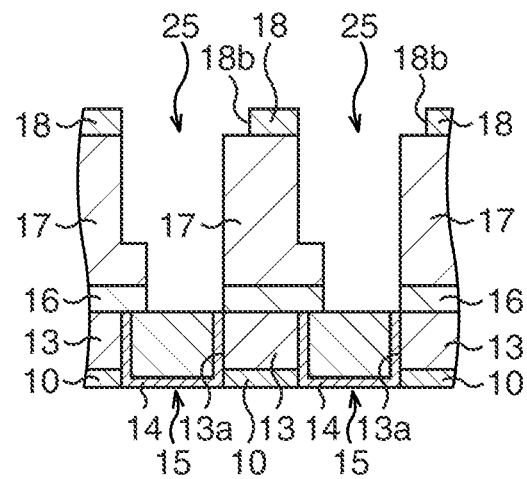
FIG. 7A is a schematic sectional view illustrating the manufacturing method of the MOS transistor according to the first embodiment subsequent to FIG. 6C.

After the wiring structure trenches 25 are formed, the second hard mask 19 is suitable to be removed by the etching as illustrated in FIG. 7A. There is a problem in which a gap where the first hard mask 18 does not partially exist is formed below the second hard mask 19 if the second hard mask 19 remains, and a base film is difficult to be adhered to the gap in a next process. Further, the deposition of the conductive material is performed after that, the conductive material is not filled in a vicinity of the gap where the base film is not adhered, and a void is generated.

Accordingly, the second hard mask 19 is removed by the dry etching when the second hard mask 19 remains after the wiring structure trenches 25 are formed.

Figure 7B:
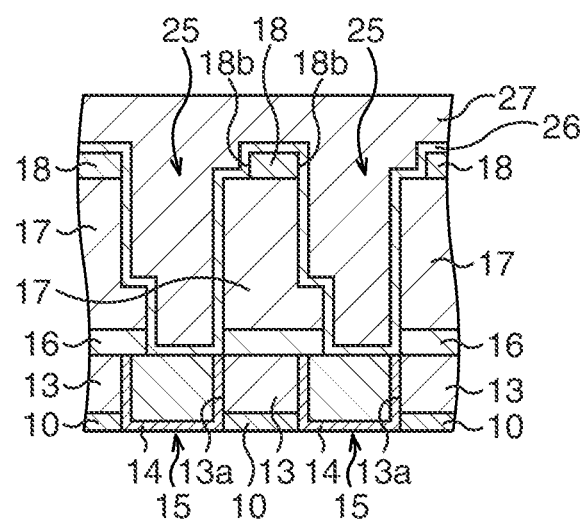
FIG. 7B is a schematic sectional view illustrating the manufacturing method of the MOS transistor according to the first embodiment subsequent to FIG. 7A.

Next, a base film 26 and a conductive material 27 are formed as illustrated in FIG. 7B.

In detail, at first, a laminated film of, for example, Ta and TaN is deposited on the first hard mask 18 for a film thickness of approximately 10 nm by the sputtering method and so on so as to cover internal surfaces of the wiring structure trenches 25 to form the base film 26 as a barrier metal.

Next, the conductive material 27 composed of, for example, Cu or a Cu alloy is formed on the first hard mask 18 so as to embed inside of the wiring structure trenches 25 via the base film 26 by the electrolytic plating method and so on.

Figure 8A:
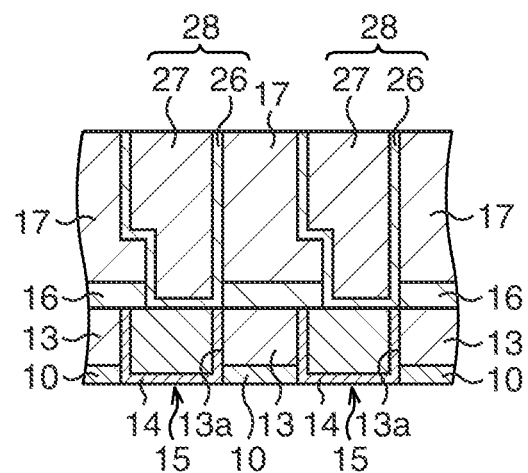
FIG. 8A is a schematic sectional view illustrating the manufacturing method of the MOS transistor according to the first embodiment subsequent to FIG. 7B.

Next, wiring structures 28 are formed as illustrated in FIG. 8A.

In detail, the conductive material 27 and the first hard mask 18 are smoothed and removed by the CMP method and so on. At this time, the interlayer insulating film 17 functions as a polishing stopper of the CMP. Inside of the wiring structure trenches 25 are filled with the conductive material 27 via the base film 26 by the smoothing, and the wiring structures 28 connected to the lower layer wirings 15 are formed. Here, the base film 26 has a function to suppress that the conductive material 27 diffuses in the interlayer insulating film 17.

Figure 8B:
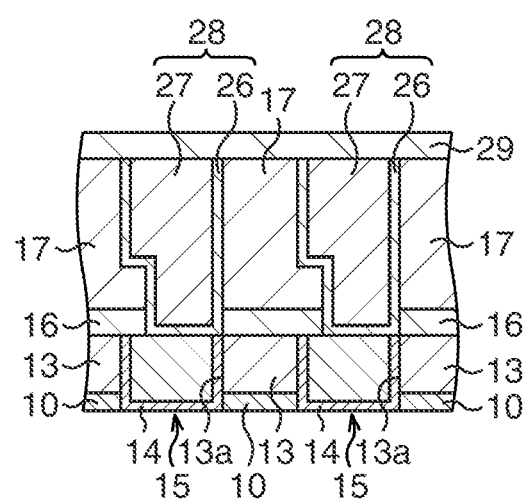
FIG. 8B is a schematic sectional view illustrating the manufacturing method of the MOS transistor according to the first embodiment subsequent to FIG. 8A.

Subsequently, a protective film 29 is formed on the interlayer insulating film 17 for a film thickness of, for example, approximately 30 nm by the CVD method and so on so as to cover upper surfaces of the wiring structures 28 as illustrated in FIG. 8B. For example, SiC is applied as an insulator forming the protective film 29.

After that, the MOS transistor is formed by going through respective processes of further formations of an interlayer insulating film, wiring structures, and upper layer wirings, and so on.

Here, problems in the conventional trench-first dual damascene method are described in detail with reference to the drawings as a comparative example of the present embodiment. The same reference numerals and symbols are used to designate the respective components and so on of the MOS transistor as same as the present embodiment for the convenience of explanation.

FIG. 9A to FIG. 9D are schematic sectional views in the comparative example to explain the problems of the conventional trench-first method. Only a portion at upward of the lower layer wiring is illustrated for the convenience of illustration.

Figure 9A:
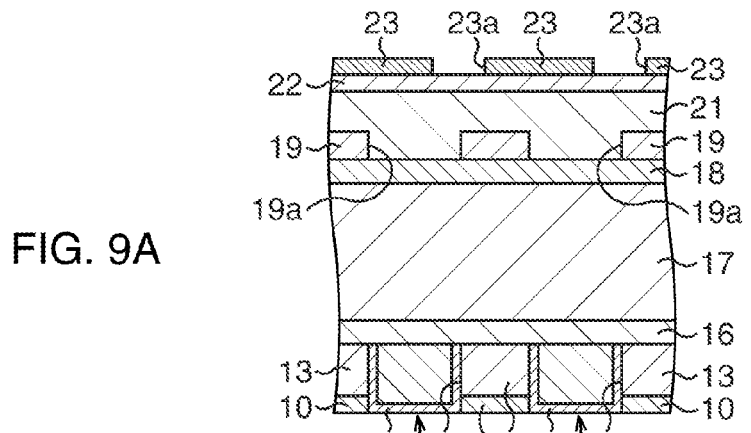
FIG. 9A is a schematic sectional view illustrating a manufacturing method of a MOS transistor according to a comparative example of the first embodiment.

At first, it becomes a state in FIG. 9A by going through the respective processes as same as FIG. 1A to FIG. 5A of the present embodiment. In FIG. 9A, a case when the openings 23a of the resist pattern 23 are formed while slightly displaced from initially planned positions (positions matching with the predetermined portions within the openings 19a of the second hard mask 19 existing at the lower layer) is exemplified.

Figure 9B:
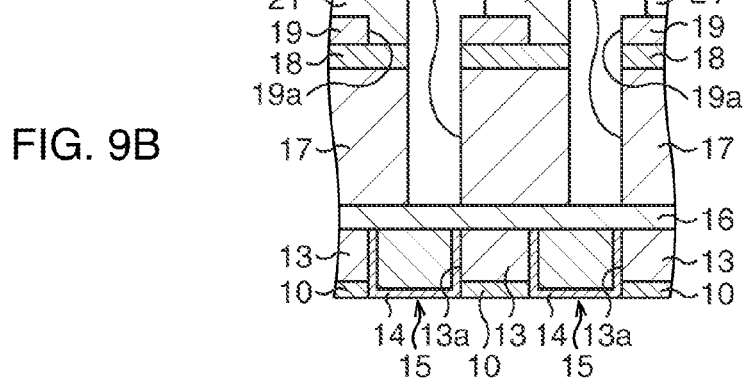
FIG. 9B is a schematic sectional view illustrating the manufacturing method of the MOS transistor according to the comparative example of the first embodiment subsequent to FIG. 9A.

Subsequently, via holes 101 are formed at the interlayer insulating film 17 as illustrated in FIG. 9B.

In the etching of the interlayer insulating film 17, the openings 23a of the resist pattern 23 are formed while positionally displaced relative to the openings 19a of the second hard mask 19 as stated above, and therefore, the etching is stopped on the second hard mask 19 partially overlapping with the openings 23a. Accordingly, the via holes 101 in narrow width hole-like shapes (for example, approximately semicircular states) defined by the openings in the wiring trench states formed at the resin film 21 and the openings 19a in the via hole shapes of the second hard mask 19 are formed at the interlayer insulating film 17. As stated above, the via holes 101 are formed at the interlayer insulating film 17 with diameters smaller than initially planned desired diameters.

Figure 9C:
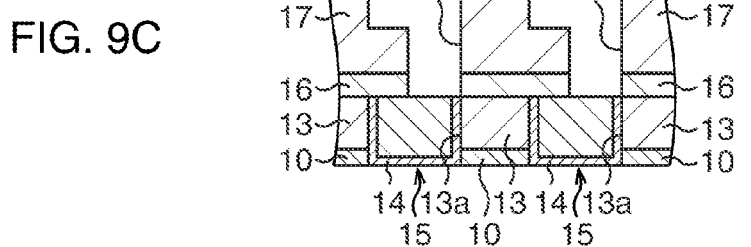
FIG. 9C is a schematic sectional view illustrating the manufacturing method of the MOS transistor according to the comparative example of the first embodiment subsequent to FIG. 9B.

Subsequently, wiring trenches 102 communicating with the via holes 101 are formed at the interlayer insulating film 17 as illustrated in FIG. 9C.

The first hard mask 18, the interlayer insulating film 17, and the protective film 16 are dry etched while using the second hard mask 19 as a mask. The via holes 101 are thereby extended and formed to penetrate the protective film 16 and the wiring trenches 102 communicating with the via holes 101 are formed at the interlayer insulating film 17.

Figure 9D:
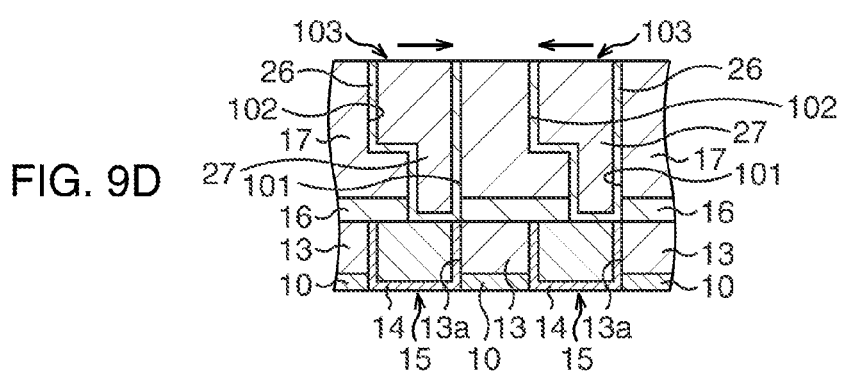
FIG. 9D is a schematic sectional view illustrating the manufacturing method of the MOS transistor according to the comparative example of the first embodiment subsequent to FIG. 9C.

Wiring structures 103 as illustrated in FIG. 9D are formed by going through the respective processes as same as FIG. 7A and FIG. 7B of the present embodiment.

As stated above, in the comparative example, a via portion 103a of the wiring structure 103 is formed with a smaller diameter than an initially planned desired diameter. Accordingly, an area of a connection portion of the via portion 103a with the lower layer wiring 15 becomes small, and an increase of a resistance value is incurred.

In the present embodiment, a process in which the isotropic etching is performed for the narrow width opening 18a of the first hard mask 18 to expand in a lateral direction is performed after the dry etching of the first hard mask 18 using the second hard mask 19, relative to the above-stated situation of the comparative example. The via holes 24 of which desired diameters are secured are thereby formed.

As it is described hereinabove, it is possible to easily and surely form the via holes 24 of which desired diameters are secured, and a semiconductor device having the high-reliable wiring structures 25 is enabled through the trench-first method is used, according to the present embodiment.

Modification Example

Here, a modification example of the first embodiment is described.

Figure 10A:
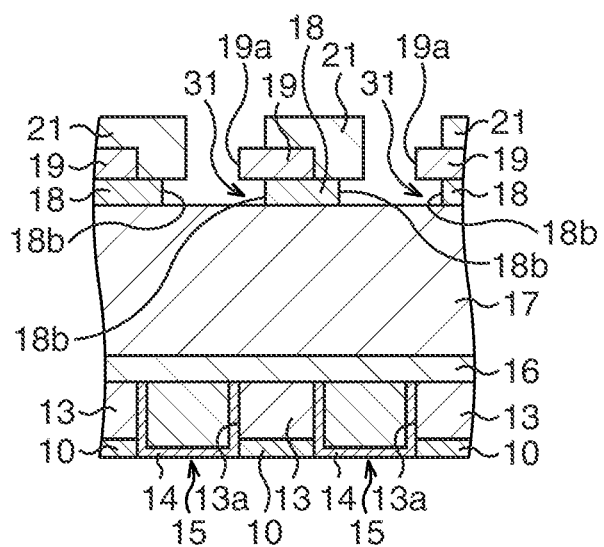
FIG. 10A is a schematic sectional view exemplifying a case when facets are generated in the first embodiment.

As illustrated in FIG. 10A, gaps 31 being spaces where the first hard mask 18 does not exist are formed below the second hard mask 19 by performing the isotropic etching of the first hard mask 18 in the process in FIG. 5C in the first embodiment.

Figure 10B:
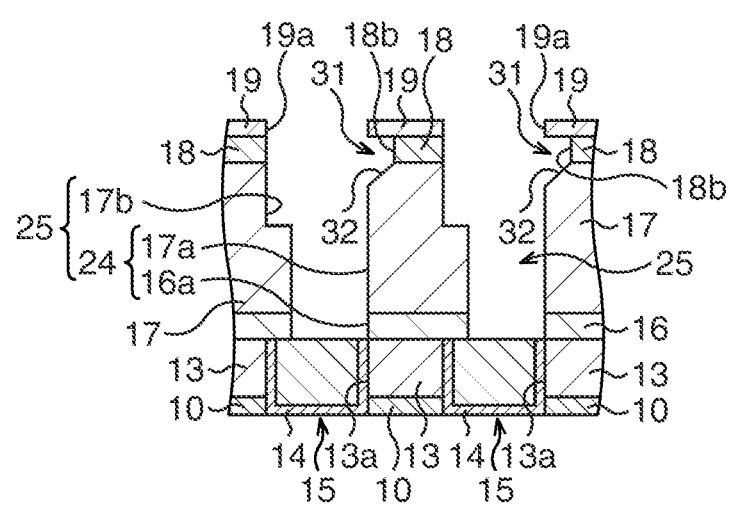
FIG. 10B is a schematic sectional view exemplifying the case when the facets are generated in the first embodiment.

In this case, there is a possibility in which so-called facets (a facetting of the wiring trench 17b) 32 are generated at one end of the upper surface of the wiring trench 17b depending on the material of the interlayer insulating film 17, the etching condition, or the like in the etching in FIG. 6A and FIG. 6B resulting from the gap 31 as illustrated in FIG. 10B. When the wiring structure is formed under a state in which the facets 32 remain, a distance between adjacent wiring structures becomes short, and there is a possibility in which inter-wiring leakage occurs.

In the present example, the facets 32 are effectively removed during the process of the wiring structure when the facets 32 are generated at the wiring trenches 17b as stated above.

Figure 11A:
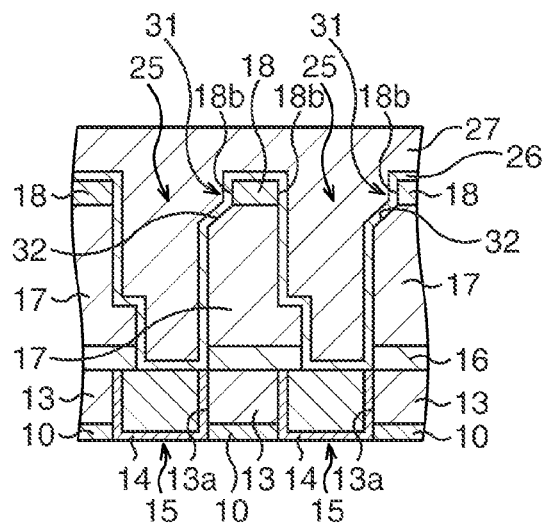
FIG. 11A is a schematic sectional view illustrating a major process of a modification example of the manufacturing method of the MOS transistor according to the first embodiment.
Figure 11B:
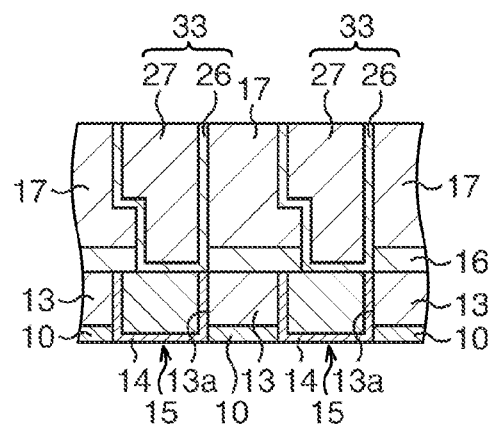
FIG. 11B is a schematic sectional view illustrating the major process of the modification example of the manufacturing method of the MOS transistor according to the first embodiment subsequent to FIG. 11A.
Figure 11C:
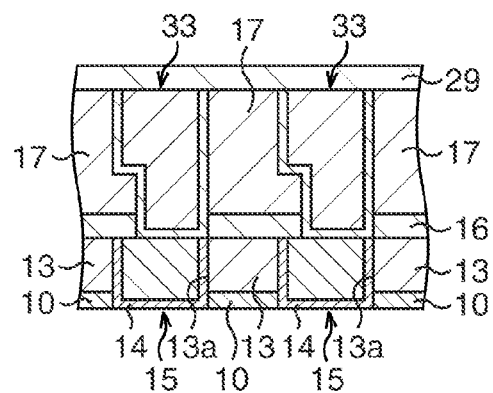
FIG. 11C is a schematic sectional view illustrating the major process of the modification example of the manufacturing method of the MOS transistor according to the first embodiment subsequent to FIG. 11B.

FIG. 11A to FIG. 11C are schematic sectional views illustrating major processes of the modification example of the manufacturing method of the MOS transistor according to the first embodiment. The same reference numerals and symbols are used to designate the respective components and so on of the MOS transistor similar to the present embodiment for the convenience of description. Only the portion at upward of the lower layer wiring is illustrated for the convenience of illustration.

At first, the respective processes as same as FIG. 1A to FIG. 6C of the present embodiment are performed. Here, the facets 32 are generated at the wiring trenches 17b as illustrated in FIG. 10B.

Subsequently, the second hard mask 19 is removed if it remains as same as FIG. 7A of the present embodiment, and thereafter, the base film 26 and the conductive material 27 are formed as same as FIG. 7B of the present embodiment as illustrated in FIG. 11A.

Subsequently, wiring structures 33 are formed as illustrated in FIG. 11B.

In detail, a surface layer portion including the conductive material 27, the first hard mask 18, and the facets 32 of the interlayer insulating film 17 is smoothed and removed by the CMP method and so on. At this time, for example, the interlayer insulating film 17 is polished for a period of time defined in advance corresponding to the removal of the surface layer portion after it is recognized that the polishing firstly reaches the interlayer insulating film 17, namely, that the first hard mask 18 is removed. The interlayer insulating film 17, the base film 26, and the conductive material 27 are thereby continuously smoothed under a state in which the surface layer portion is removed. At this time, an inside of the wiring structure trench 25 without the facet is filled with the conductive material 27 via the base film 26, and the wiring structures 33 connected to the lower layer wirings 15 are formed.

Subsequently, the protective film 29 is formed on the interlayer insulating film 17 so as to cover upper surfaces of the wiring structures 33 as same as FIG. 7C of the present embodiment as illustrated in FIG. 11C.

After that, the MOS transistor is formed by going through the respective processes of further formations of an interlayer insulating film, wiring structures, upper layer wirings and so on.

As it is described above, according to the present example, it is possible to easily and surely form the via holes 24 of which desired diameters are secured even when the facets 32 are generated at the wiring trenches 17b, and the semiconductor device having the high reliable wiring structures 33 is enabled.

Second Embodiment

In the present embodiment, a manufacturing method of a MOS transistor using the trench-first dual damascene method is disclosed as same as the first embodiment, but it is different from the first embodiment in a point that a hard mask used when the wiring structures are formed is in a three-layer constitution.

FIG. 12A to FIG. 15B are schematic sectional views illustrating major processes of the manufacturing method of the MOS transistor according to the second embodiment. Besides, FIG. 16A to FIG. 17B are schematic perspective views corresponding to FIG. 12C to FIG. 13C, FIG. 14B. The same reference numerals and symbols are used to designate the respective components and so on of the MOS transistor similar to the first embodiment for the convenience of description. Besides, only the portion at upward of the lower layer wiring is illustrated in FIG. 12A to FIG. 15B, and only a portion at upward of the protective film 16 is illustrated in FIG. 16A to FIG. 17B respectively for the convenience of illustration.

At first, the respective processes as same as FIG. 1A to FIG. 4B of the first embodiment are performed.

Figure 12A:
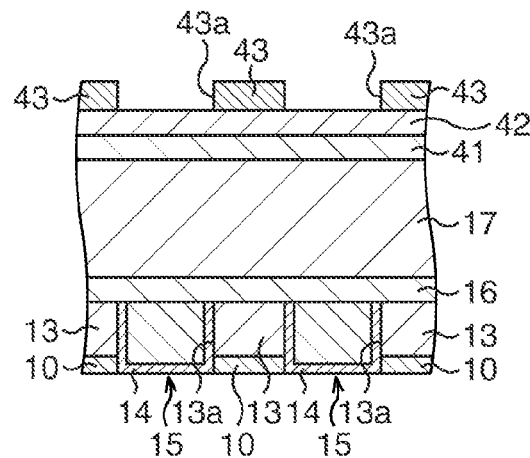
FIG. 12A is a schematic sectional view illustrating a manufacturing method of a MOS transistor according to a second embodiment.

Subsequently, a first hard mask 41, a second hard mask 42, and a third hard mask 43 constituting the three-layer hard mask are lamination-formed on the interlayer insulating film 17 as illustrated in FIG. 12A.

In detail, the first hard mask 41 is formed on the interlayer insulating film 17 for a film thickness of approximately 30 nm, the second hard mask 42 is formed on the first hard mask 41 for a film thickness of approximately 60 nm, and the third hard mask 43 is formed on the second hard mask 42 for a film thickness of approximately 30 nm, in sequence. The third hard mask 43 is processed by the lithography and the dry etching, and openings 43a to form wiring trenches of a wiring part being a component of a wiring structure are formed at the third hard mask 43.

The first hard mask 41, the second hard mask 42, and the third hard mask 43 are respectively composed of different materials.

For example, one kind selected from $SiO_2$, SiC is applied as the material forming the first hard mask 41, for example, one kind selected from $SiO_2$, SiN is applied as the material forming the second hard mask 42, and for example, one kind selected from TiN, TaN, SiC is applied as the material forming the third hard mask 43. It is possible to use by arbitrary combining the above-stated materials as the material of the first hard mask 41, the material of the second hard mask 42, and the material of the third hard mask 43. Here, a case is exemplified in which $SiO_2$ is used as the material of the first hard mask 41, SiN is used as the material of the second hard mask 42, and TiN or TaN (hereinafter, referred to as TiN and so on) is used as the material of the third hard mask 43. SiC may be used as the material of the first hard mask 41, $SiO_2$ may be used as the material of the second hard mask 42, and TiN and so on may be used as the material of the third hard mask 43. $SiO_2$ may be used as the material of the first hard mask 41, SiN may be used as the material of the second hard mask 42, and SiC may be used as the material of the third hard mask 43.

Figure 12B:
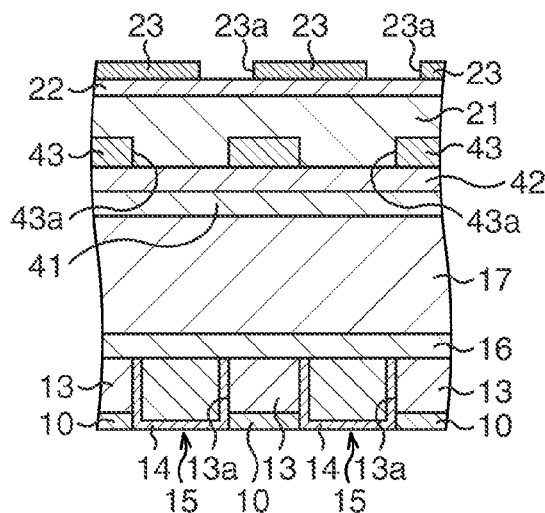
FIG. 12B is a schematic sectional view illustrating the manufacturing method of the MOS transistor according to the second embodiment subsequent to FIG. 12A.

Subsequently, the resin film 21, the TEOS film 22, and the resist pattern 23 are sequentially formed on the third hard mask 43 as same as FIG. 5A as illustrated in FIG. 12B. Note that a case when the openings 23a of the resist pattern 23 are formed to be slightly displaced from initially planned positions (positions matching with predetermined portions within openings 43a of the third hard mask 43 existing at a lower layer) is exemplified in FIG. 12B.

Figure 12C:
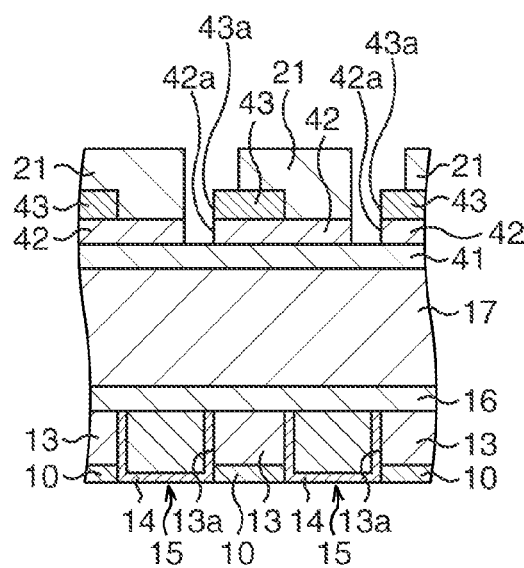
FIG. 12C is a schematic sectional view illustrating the manufacturing method of the MOS transistor according to the second embodiment subsequent to FIG. 12B.
Figure 16A:
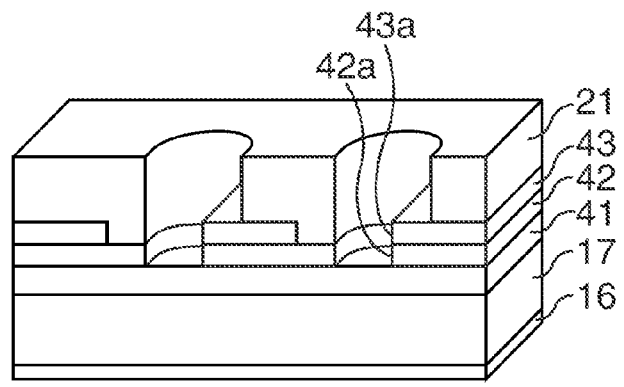
FIG. 16A is a schematic perspective view corresponding to FIG. 12C.

Subsequently, the second hard mask 42 is processed by the dry etching as illustrated in FIG. 12C and FIG. 16A.

In detail, the TEOS film 22, the resin film 21, and the second hard mask 42 are processed by the dry etching while using the resist pattern 23 as a mask.

At first, the gas containing oxygen is used as the etching gas, and the TEOS film 22 and the resin film 21 are etched. The resin film 21 is the organic material, and therefore, it is etched by the plasma of the gas containing oxygen. On the other hand, SiN of the second hard mask 42 and TiN and so on of the third hard mask 43 are difficult to be etched by the plasma of the gas containing oxygen. Accordingly, it is possible to appropriately stop the dry etching on the second hard mask 42 and on the third hard mask 43.

Subsequent to the etching of the TEOS film 22 and the resin film 21, the second hard mask 42 is dry etched. At this time, a condition in which an etching rate of SiN of the second hard mask 42 is higher than TiN and so on of the third hard mask 43 and $SiO_2$ of the first hard mask 41 is selected so that the third hard mask 43 and the first hard mask 41 are not etched. Specifically, for example, the high-frequency power (13.56 MHz) of 500 W is applied to the plate electrode at the pressure of 50 mT to perform the dry etching under the condition of the substrate temperature of 25° C. while introducing the mixed gas of $CH_3F$ gas with the flow rate of 50 sccm, $O_2$ gas with the flow rate of 30 sccm, and Ar gas with the flow rate of 500 sccm as the etching gas into the chamber inside the vacuum chamber of the parallel plate type reactive ion etching device. It is possible to appropriately stop the dry etching on the first hard mask 41 under this etching condition because etching selection ratio of SiN to $SiO_2$ is high.

In the etching of the second hard mask 42, the openings 23a of the resist pattern 23 are formed while being positionally displaced relative to the openings 43a of the third hard mask 43 as stated above. Accordingly, narrow-width openings 42a in hole like shapes (for example, approximately a semicircular state) defined by the openings in via hole shapes formed at the resin film 21 and the openings 43a in wiring trench shapes of the third hard mask 43 are formed at the second hard mask 42.

The resist pattern 23 and the TEOS film 22 are removed until a completion of the isotropic etching of the second hard mask 42.

Figure 13A:
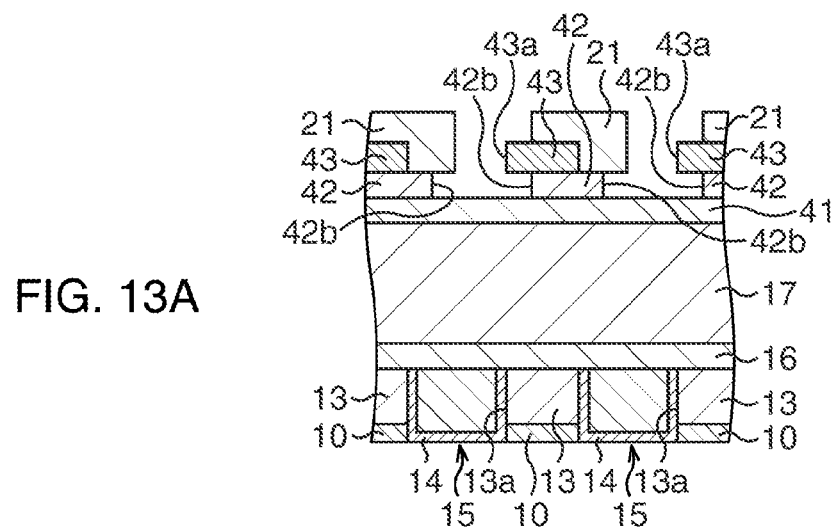
FIG. 13A is a schematic sectional view illustrating the manufacturing method of the MOS transistor according to the second embodiment subsequent to FIG. 12C.
Figure 16B:
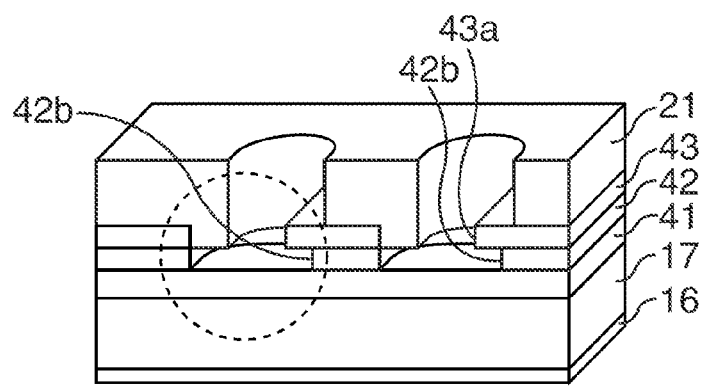
FIG. 16B is a schematic perspective view corresponding to FIG. 13A.

Subsequently, the isotropic etching is performed to expand the openings 42a by performing the side etching of the second hard mask 42 in a direction parallel to the surface of the semiconductor substrate 1 as illustrated in FIG. 13A and FIG. 16B. The diameters of the openings 42a are expanded to be openings 42b in approximately hole states by this isotropic etching.

The chemical dry etching or the wet etching is conceivable as the isotropic etching.

The chemical dry etching is performed under a condition in which the mixed gas of $CF_4$ gas with the flow rate of 100 sccm and $O_2$ gas with the flow rate of 150 sccm is used as the etching gas, the plasma is generated by remote by exciting with the high-frequency power of 400 W to introduce into the vacuum chamber, under the pressure of 300 mTorr and the substrate temperature of 25° C. by, for example, the downflow type chemical dry etching device.

The wet etching uses, for example, the solution of hydrofluoric acid as the etching solution. The mixed solution of the hydrofluoric acid and ammonium fluoride is used as the etching solution, and the etching may be performed by using the solution of which pH is adjusted. The composition of the etching solution is not limited to the above, but it is suitable to select the chemical solution in which the etching rate of the second hard mask 42 becomes larger than the etching rates of the resin film 21, the third hard mask 43, and the first hard mask 41.

Figure 13B:
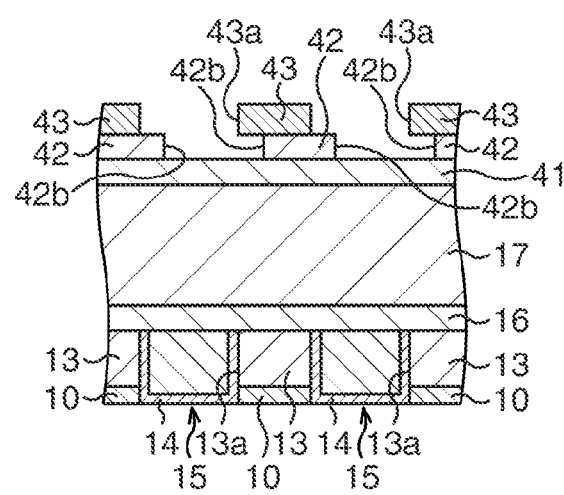
FIG. 13B is a schematic sectional view illustrating the manufacturing method of the MOS transistor according to the second embodiment subsequent to FIG. 13A.
Figure 16C:
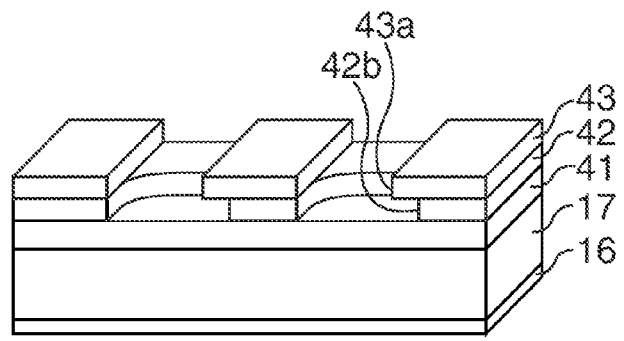
FIG. 16C is a schematic perspective view corresponding to FIG. 13B.

Subsequently, the resin film 21 is removed by asking as illustrated in FIG. 13B and FIG. 16C.

Figure 13C:
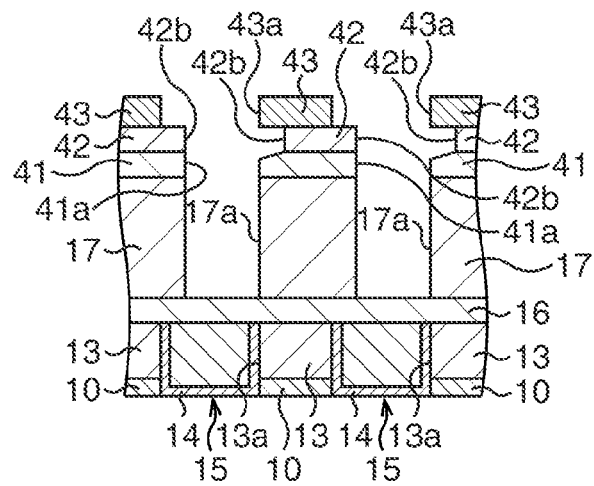
FIG. 13C is a schematic sectional view illustrating the manufacturing method of the MOS transistor according to the second embodiment subsequent to FIG. 13B.
Figure 17A:
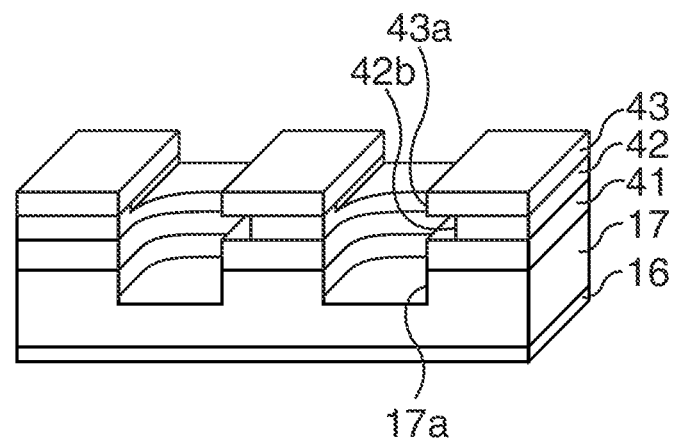
FIG. 17A is a schematic perspective view corresponding to FIG. 13C.

Next, openings 41a and the openings 17a in the via hole states are formed at the first hard mask 41 and the interlayer insulating film 17 as illustrated in FIG. 13C and FIG. 17A. Note that it is illustrated up to a middle of the dry etching of the interlayer insulating film 17 in FIG. 17A.

In detail, the first hard mask 41 and the interlayer insulating film 17 are dry etched by using the second hard mask 42 and the third hard mask 43 as masks. This dry etching is necessary to be performed with an etching condition of which etching selection ratios of $SiO_2$ and SiOC to SiN and TiN and so on are high so that $SiO_2$ of the first hard mask 41 and SiOC of the interlayer insulating film 17 are etched and SiN of the second hard mask 42 and TiN and so on of the third hard mask 43 are not etched. At this time, the second hard mask 42 and the third hard mask 43 become the masks, and the first hard mask 41 and the interlayer insulating film 17 are etched in shapes each following a portion where the opening 42b of the second hard mask 42 and the opening 43a of the third hard mask 43 are overlapped, and the openings 41a in the via hole shapes are formed at the first hard mask 41 and the openings 17a in the via hole shapes are formed at the interlayer insulating film 17.

Figure 14A:
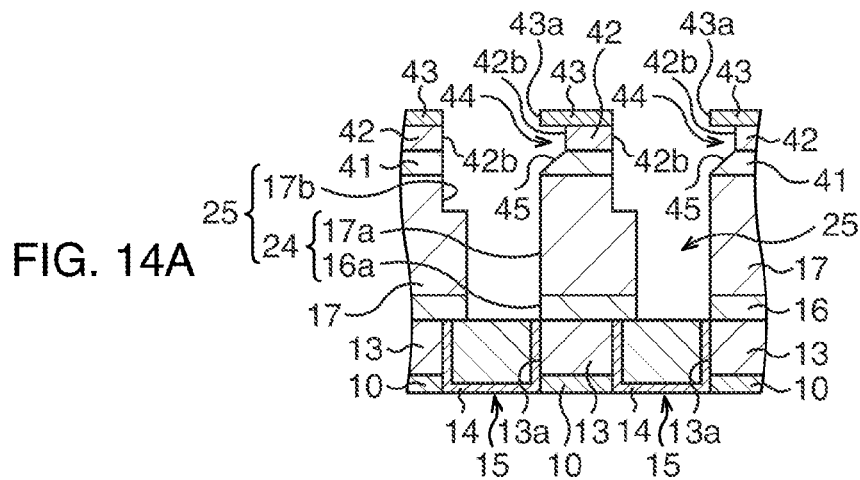
FIG. 14A is a schematic sectional view illustrating the manufacturing method of the MOS transistor according to the second embodiment subsequent to FIG. 13C.

Subsequent to the etching of the first hard mask 41 and the interlayer insulating film 17, the second hard mask 42, the first hard mask 41, the upper portion of the interlayer insulating film 17, and the protective film 16 are dry etched while using the third hard mask 43 as a mask as illustrated in FIG. 14A. This dry etching is necessary to be performed with an etching condition of which etching selection ratios of SiN, $SiO_2$, SiOC, and SiC to TiN and so on are high so that SiN of the second hard mask 42, $SiO_2$ of the first hard mask 41, SiOC of the interlayer insulating film 17, and SiC of the protective film 16 are etched, and TiN and so on of the third hard mask 43 are not etched. At this time, the third hard mask 43 becomes the mask, and the second hard mask 42, the first had mask 41, and the upper portion of the interlayer insulating film 17 are etched in shapes following the openings 43a of the third hard mask 43. At the same time, the openings 16a in the via hole shapes following the openings 17a of the interlayer insulating film 17 are formed at the protective film 16, and a part of the surfaces of the lower layer wirings 15 exposes. At this time, the wiring trenches 17b are formed at the upper portion of the interlayer insulating film 17, and the via holes 24 each made up of the opening 17a and the opening 16a are formed at a lower portion of the interlayer insulating film 17 and the protective film 16. The wiring trench 17b and the via hole 24 are communicated to constitute the wiring structure trench 25.

In the present embodiment, a case in which facets resulting that gaps 44 each being a space where the second hard mask 42 does not exist below the third hard mask 43 are generated caused by the isotropic etching of the second hard mask 42 is exemplified as same as the modification example of the first embodiment. In the present embodiment, the first hard mask 41 is provided between the interlayer insulating film 17 and the second hard mask 42 which is performed the isotropic etching as illustrated in FIG. 14A. Accordingly, the first hard mask 41 functions as a buffer layer of the interlayer insulating film 17, and the facets may locally exist only at the first hard mask 41 even if the facets are generated. This facet is referred to as a reference numeral 45.

Figure 14B:
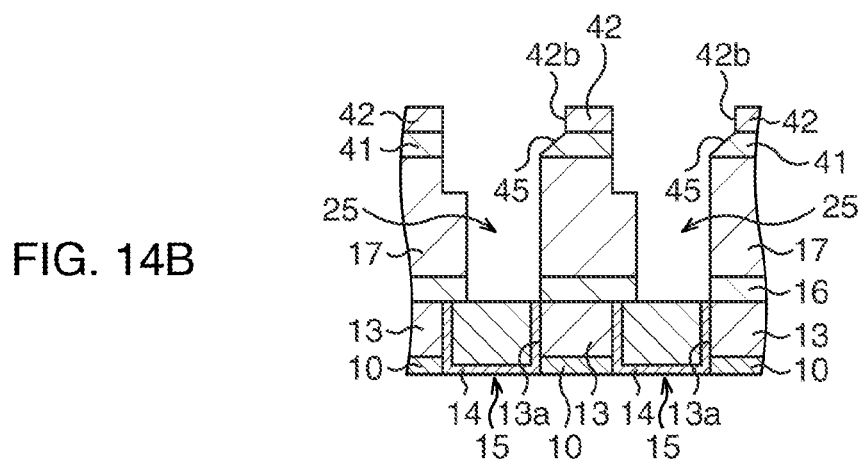
FIG. 14B is a schematic sectional view illustrating the manufacturing method of the MOS transistor according to the second embodiment subsequent to FIG. 14A.
Figure 17B:
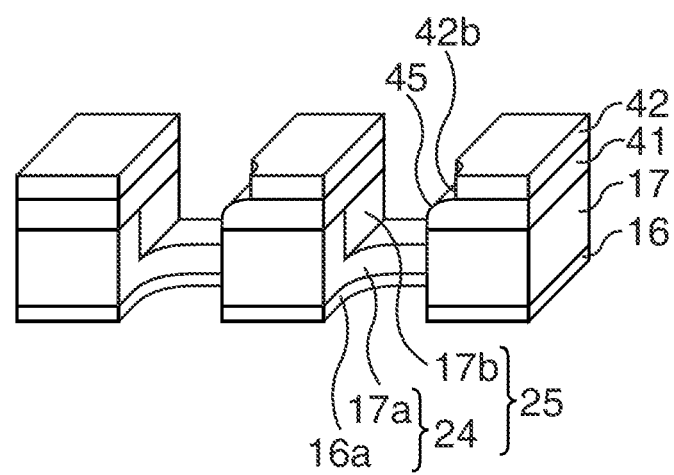
FIG. 17B is a schematic perspective view corresponding to FIG. 14B.

As illustrated in FIG. 14B and FIG. 17B, the third hard mask 43 is suitable to be removed by the etching after the wiring structure trenches 25 are formed. When the third hard mask 43 remains, there is a problem in which a gap where the second hard mask 42 does not partially exist remains below the third hard mask 43, and a base film is difficult to be adhered to the gap in a next process. Further, the deposition of the conductive material is performed after that, the conductive material is not filled in a vicinity of the gap where the base film is not adhered, and the void is generated.

Accordingly, the third hard mask 43 is removed by the dry etching when the third hard mask 43 remains after the wiring structure trenches 25 are formed.

Figure 14C:
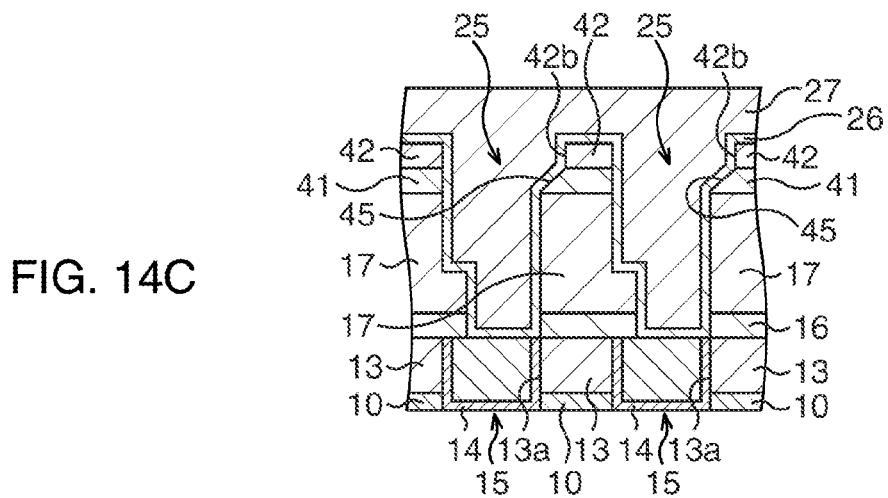
FIG. 14C is a schematic sectional view illustrating the manufacturing method of the MOS transistor according to the second embodiment subsequent to FIG. 14B.

Next, the base film 26 and the conductive material 27 are formed as illustrated in FIG. 14C.

In detail, at first, a laminated film of, for example, Ta and TaN is deposited on the second hard mask 42 for a film thickness of approximately 10 nm by the sputtering method and so on so as to cover the internal surfaces of the wiring structure trenches 25 to form the base film 26 as a barrier metal.

Next, the conductive material 27 composed of, for example, Cu or the Cu alloy is formed on the second hard mask 42 so as to embed inside of the wiring structure trenches 25 via the base film 26 by the electrolytic plating method and so on.

Figure 15A:
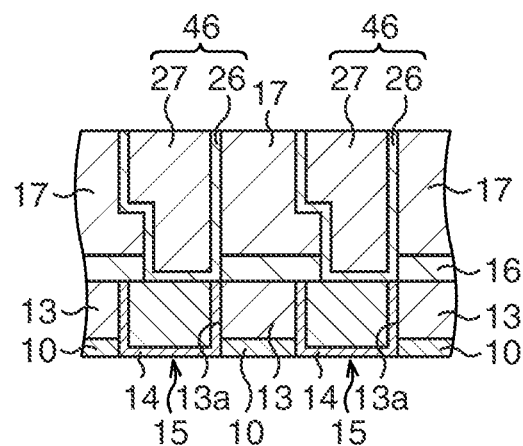
FIG. 15A is a schematic sectional view illustrating the manufacturing method of the MOS transistor according to the second embodiment subsequent to FIG. 14C.

Next, wiring structures 46 are formed as illustrated in FIG. 15A.

In detail, the conductive material 27, the second hard mask 42, and the first hard mask 41 are smoothed and removed by the CMP method and so on. At this time, the interlayer insulating film 17 functions as a polishing stopper of the CMP. Each inside of the wiring structure trenches 25 is filled with the conductive material 27 via the base film 26 by the smoothing, and the wiring structures 46 connected to the lower layer wirings 15 are formed. Here, the base film 26 has a function to suppress that the conductive material 27 diffuses in the interlayer insulating film 17.

Further, in the present embodiment, the facets 45 are locally generated only at the first hard mask 41, and there is no facet at the interlayer insulating film 17. In the smoothing process forming the wiring structures 46, the first hard mask 41 is removed together with the conductive material 27 and the second hard mask 42, and thereby, the facets can be simultaneously and surely removed.

Figure 15B:
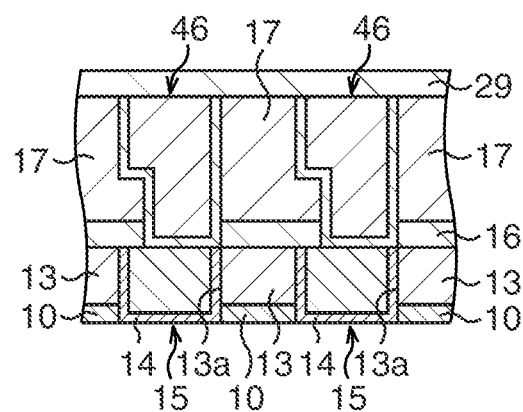
FIG. 15B is a schematic sectional view illustrating the manufacturing method of the MOS transistor according to the second embodiment subsequent to FIG. 15A.

Subsequently, the protective film 29 is formed on the interlayer insulating film 17 so as to cover upper surfaces of the wiring structures 46 as same as FIG. 8B of the first embodiment as illustrated in FIG. 15B. After that, the MOS transistor is formed by going through respective processes of further formations of an interlayer insulating film, wiring structures, and upper layer wirings, and so on.

As stated above, it becomes possible to easily and surely form the via holes 24 of which desired diameters are secured without increasing the processes even when the facets are generated, and a semiconductor device having the high-reliable wiring structures 46 is enabled according to the present embodiment.

According to the above-stated respective aspects, a small-sizing of diameters of via holes caused by a positional displacement between wiring trenches and an opening pattern of via holes is suppressed, the via holes of which desired diameters are secured can be easily and surely formed, and a semiconductor device having high-reliable wiring structures is enabled even if a trench-first method is used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

According to the present application, it becomes possible to easily and surely form the via holes of which desired diameters are secured, and a semiconductor device having high-reliable wiring structures is enabled.

What is claimed is:

1. A manufacturing method of a semiconductor device, comprising:
    forming a first interlayer insulating film above a semiconductor substrate;
    forming a wiring layer in the first interlayer insulating film;
    forming a second interlayer insulating film above the first interlayer insulating film and the wiring layer;
    forming a first mask layer above the second interlayer insulating film and forming a second mask layer above the first mask layer;
    forming a first opening portion in the second mask layer;
    forming a resist layer including a second opening portion above the second mask layer at a position at least partially overlapping with the first opening portion;
    performing a first etching in which the first mask layer is etched while using the resist layer as a mask or the resist layer and the second mask layer as masks;
    performing a second etching in which the first mask layer is etched in a direction parallel to a surface of the semiconductor substrate after the performing the first etching;
    forming connection holes in the second interlayer insulating film by etching the second interlayer insulating film while using the first mask layer and the second mask layer as masks after the performing the second etching;
    forming wiring trenches in the second interlayer insulating film by etching the first mask layer and the second interlayer insulating film while using the second mask layer as a mask after the forming the connection holes; and
    forming a conductive film in the connection holes and the wiring trenches.

2. The manufacturing method of the semiconductor device according to claim 1, further comprising:
    performing polishing in which the conductive film and the first mask layer above the second interlayer insulating film are removed after the forming the conductive film.

3. The manufacturing method of the semiconductor device according to claim 2,
    wherein the second interlayer insulating film and a surface layer portion of the conductive film are removed subsequently after the conductive film and the first mask layer above the second interlayer insulating film are removed in the performing the polishing.

4. The manufacturing method of the semiconductor device according to claim 1,
    wherein an etching rate of the first mask layer is higher than an etching rate of the second mask layer in the performing the second etching.

5. The manufacturing method of the semiconductor device according to claim 4,
    wherein the first mask layer is composed of one selected from SiO2, SiN, and
    the second mask layer is composed of one selected from TiN, TaN, SiC.

6. The manufacturing method of the semiconductor device according to claim 1,
    wherein a chemical dry etching or a wet etching is performed in the performing the second etching.

7. The manufacturing method of the semiconductor device according to claim 1, further comprising:
    removing the second mask layer after the forming the wiring trenches at the second interlayer insulating film and before the forming the conductive film.

8. A manufacturing method of a semiconductor device, comprising:
    forming a first interlayer insulating film above a semiconductor substrate;
    forming a wiring layer in the first interlayer insulating film;
    forming a second interlayer insulating film above the first interlayer insulating film and the wiring layer;
    forming a first mask layer above the second interlayer insulating film, forming a second mask layer above the first mask layer, and forming a third mask layer above the second mask layer;
    forming a first opening portion in the third mask layer;
    forming a resist layer including a second opening portion above the third mask layer at a position at least partially overlapping with the first opening portion;
    performing a first etching in which the second mask layer is etched while using the resist layer and the third mask layer as masks;
    performing a second etching in which the second mask layer is etched in a direction parallel to a surface of the semiconductor substrate after the performing the first etching;
    forming connection holes in the second interlayer insulating film by etching the first mask layer and the second interlayer insulating film while using the third mask layer and the second mask layer as masks after the performing the second etching;

forming wiring trenches in the second interlayer insulating film by etching the second mask layer, the first mask layer and the second interlayer insulating film while using the third mask layer as a mask after the forming the connection holes;

forming a conductive film in the connection holes and the wiring trenches; and removing the first mask layer, the second mask layer, and the conductive film above the second interlayer insulating film by polishing after the forming the conductive film.

9. The manufacturing method of the semiconductor device according to claim 8, wherein an etching rate of the second mask layer is higher than etching rates of the first mask layer and the third mask layer in the performing the second etching.

10. The manufacturing method of the semiconductor device according to claim 9, wherein the first mask layer, the second mask layer, and the third mask layer are respectively composed of different materials, the first mask layer is composed of one selected from SiO2, SiC, the second mask layer is composed of one selected from SiO2, SiN, and the third mask layer is composed of one selected from TiN, TaN, SiC.

11. The manufacturing method of the semiconductor device according to claim 8, wherein a chemical dry etching or a wet etching is performed in the performing the second etching.

12. The manufacturing method of the semiconductor device according to claim 8, further comprising:

removing the third mask layer after the forming the wiring trenches at the second interlayer insulating film and before the forming the conductive film.

* * * * *